United States Patent
Moldavsky et al.

(10) Patent No.: US 6,570,374 B1
(45) Date of Patent: May 27, 2003

(54) VACUUM CHUCK WITH INTEGRATED ELECTRICAL TESTING POINTS

(75) Inventors: Boris Moldavsky, Irvine, CA (US); David Mincemeyer, Santa Ana, CA (US); Jaime Araya, Long Beach, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/602,813

(22) Filed: Jun. 23, 2000

(51) Int. Cl.⁷ ............................................. G01R 31/28
(52) U.S. Cl. ..................... 324/158.1; 279/3; 279/904
(58) Field of Search ........................ 324/158.1, 762, 324/765, 760; 165/80.1–80.4; 361/234, 230–235; 257/723, 727; 279/3, 904; 269/21

(56) References Cited

U.S. PATENT DOCUMENTS

| | | | | |
|---|---|---|---|---|
| 3,437,929 A | * | 4/1969 | Glenn | 324/158.1 |
| 3,584,741 A | * | 6/1971 | Schirmer | 324/158.1 |
| 3,949,295 A | | 4/1976 | Moorshead | 324/158 |
| 4,625,164 A | * | 11/1986 | Golder et al. | 324/158.1 |
| 4,672,313 A | | 6/1987 | Hartmann et al. | 324/158 |
| 5,012,187 A | | 4/1991 | Littlebury | 324/158 |
| 5,203,401 A | * | 4/1993 | Hamburgen et al. | 165/80.4 |
| 5,703,493 A | | 12/1997 | Weeks et al. | 324/755 |
| 5,886,863 A | * | 3/1999 | Nagasaki et al. | 361/234 |
| 5,894,225 A | * | 4/1999 | Coffin | 324/762 |
| 5,907,246 A | | 5/1999 | Abraham et al. | 324/760 |
| 6,147,400 A | * | 11/2000 | Faraci et al. | 257/723 |
| 6,228,685 B1 | * | 5/2001 | Beroz et al. | 438/116 |

FOREIGN PATENT DOCUMENTS

EP 0 433 503 6/1991

* cited by examiner

*Primary Examiner*—Kamand Cuneo
*Assistant Examiner*—Jimmy Nguyen
(74) *Attorney, Agent, or Firm*—Rutan & Tucker, LLP; Robert D. Fish; David J. Zoetewey

(57) ABSTRACT

A vacuum chuck with a conductive circuit embedded onto it's surface wherein the chuck provides a reliable conductive path for electrical testing as well as reliable and uniform mechanical support over the entire area of a flexible panel to be tested. In one possible form, the chuck comprises an air permeable fine grain porous alumina ceramic module having a surface coated with conductive material wherein the coating is thin enough that it does not prevent air from passing through the conductive material or the ceramic module. The conductive material may also be etched or otherwise formed into a conductive pattern to facilitate testing of a panel.

12 Claims, 2 Drawing Sheets

VACUUM CHUCK WITH INTEGRATED ELECTRICAL TESTING POINTS

FIELD OF THE INVENTION

The field of the invention is electrical test systems.

BACKGROUND OF THE INVENTION

The use of flexible substrates in the production of interconnects and circuits is becoming more and more prevalent. Such devices often comprise at least one flexible panel having conductive layers on two outer, opposing surfaces. In order to verify that such devices were properly manufactured, it is desirable to subject such panels to testing. However, testing of flexible panels tends to be a difficult and time consuming process.

A potential method of testing involves the use of test probes to establish a voltage or cause a current to flow between test points on opposite sides of the panel. This method tends not to work on flexible panels due to flexing of the panel during testing. Another method of testing involves laying the panel on a conductive test surface, using a test probe to apply a voltage or current to a test point of the panel and measuring the corresponding change in voltage and/or current between the test point and the test surface. When such methods are used with flexible panels, problems with poorly established or broken flow paths between the test point and test surface caused or related to the panel flexing away from the test surface are sometimes encountered. Methods involving probing from one side of the panel with conductive material shorting the opposite side are not reliable as the panel with its conductive layers is not sufficiently compliant.

Thus, there is a continuing need for new methods and devices to facilitate the testing of flexible substrate based circuits and interconnects.

SUMMARY OF THE INVENTION

The present invention is directed to a vacuum chuck with a conductive circuit embedded onto it's surface wherein the chuck provides a reliable conductive path for electrical testing as well as reliable and uniform mechanical support over entire area of the flexible panel. In a preferred embodiment, the chuck comprises a fine grain porous alumina ceramic base having a surface coated with conductive material wherein the coating is thin enough that it does not block the air evacuation path, and is etched or otherwise formed into a conductive pattern to facilitate testing of a panel.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
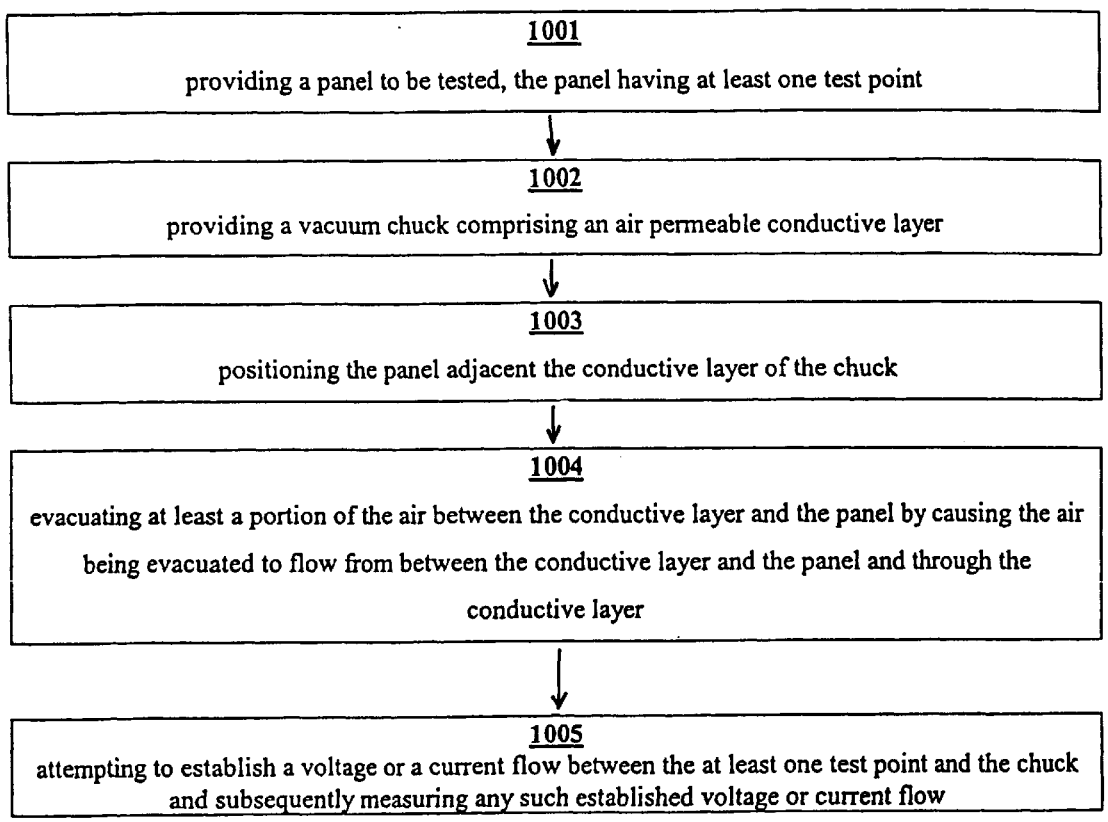
FIG. 1 is a diagram of a method embodying the subject matter claimed herein.
Figure 2:
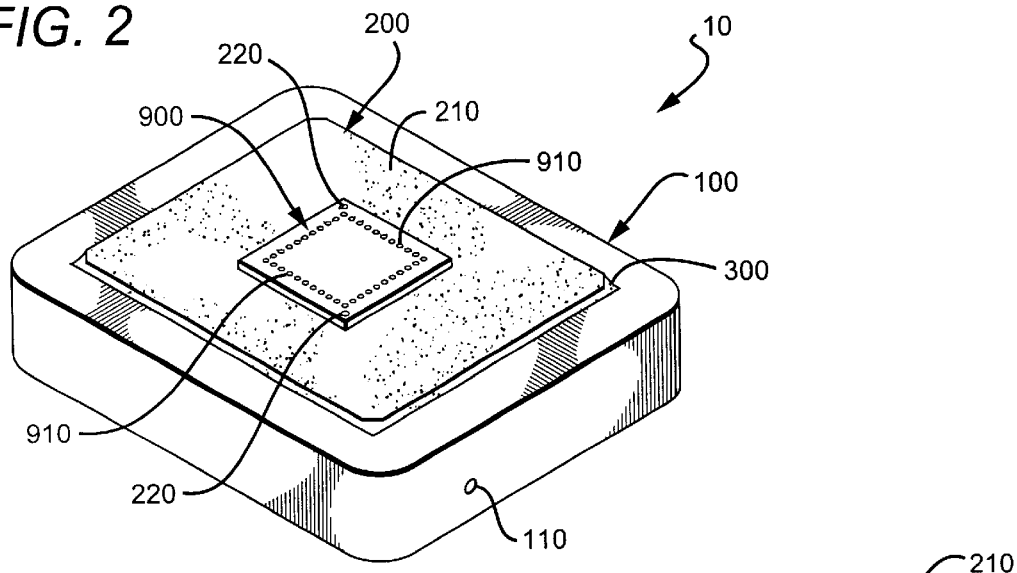
FIG. 2 is an partially exploded perspective view of a chuck embodying the invention.
Figure 3:
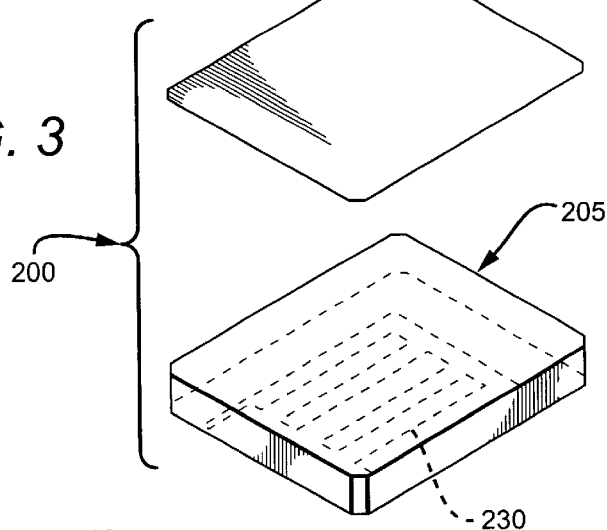
FIG. 3 is a perspective view of a ceramic module bearing a patterned conductive layer.
Figure 4:
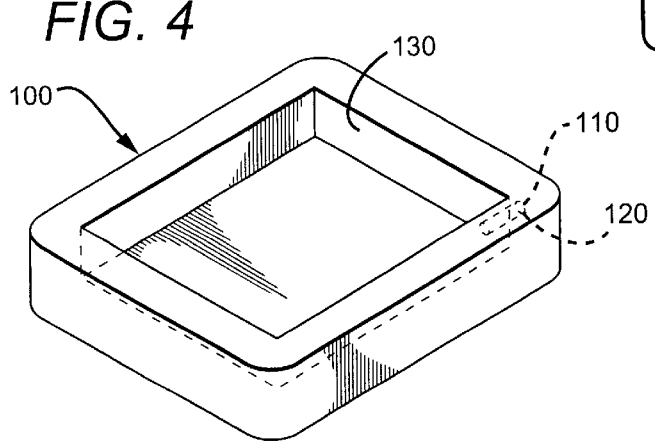
FIG. 4 is a perspective view of a conductive base.

Referring to FIGS. 2–4, a vacuum chuck 10 comprises a base 100, and a porous ceramic module 200. Base 100 comprises vacuum port 110, vacuum line 120,; and recess 130. Porous ceramic module 200 comprises a porous ceramic member 205, conductive layer 210, and possibly a plurality of alignment pins and/or a heating element 230. Chuck 10 further comprises conductive epoxy 300 electrically coupling conductive layer 210 to base 100. A panel 900 comprising test points 910 is also shown.

When a panel 900 having test points 910 is ready for test it is placed on the chuck's aligning features such as pins 220 with the test points 910 of one side facing down. Applying vacuum to vacuum port 110 results in the panel 900 being sucked against the flat conductive surface/layer 210 of the chuck 10. Thus the panel 900 makes electrical contact with the conductive circuit or circuits formed onthe vacuum chuck 10 as conductive layer 210. The flat solid support of vacuum chuck 10 allows probing (testing) from the side of the panel 900 not in contact with the chuck 10 to test the electrical characteristics of the panel 900. Testing from the opposite side of the panel 900 can be accomplished by turning the panel over if complete testing cannot be accomplished through the use of a patterned conducive layer 210.

Base 100 is preferably conductive and electrically coupled via a conductive adhesive (preferably an epoxy) to conductive layer 210. Base 100 preferably comprises a recess 130 sized and dimensioned to receive ceramic module 200, as well as one or more vacuum/fluid lines 120 allowing air to be transferred from recess 130 through the base 100 via the vacuum lines 120 and out vacuum port 110 when vacuum is applied to vacuum port 110. Alternative embodiment may utilize a base which is not conductive, and/or which do not comprise a vacuum port, vacuum line, or recess. The base need not be conductive if electrical connectivity with conductive layer 210 can be established directly or via ceramic module 200 rather than via base 100. Similarly, if air adjacent to conductive layer 210 can be evacuated through the conductive layer by applying vacuum to one or more ports in the ceramic module 200, then base 100 need not comprise any air flow paths such as that formed by recess 130 and vacuum port 110.

Ceramic module 200 is preferably made from fine grain porous alumina ceramic. One of its surfaces is coated (by sputtering or other means) with conductive material such as chrome, copper, gold etc. to form conductive layer 210. Although module 200 may comprise any air permeable material, a fine grain porous alumina ceramic is preferred because of its various physical and electrical characteristics. One particularly advantageous characteristic is the ability to withstand the temperatures experienced when sputtering methods are used to coat module 200 with a conductive layer.

The coating/conductive layer 210 is preferably thin enough that it does not prevent air from flowing into ceramic module 200 (i.e. it does not block the air evacuation path). If required, the conductive surface can be delineated using laser scribing, chemical etching, selective sputtering or other techniques to form a circuit which facilitates testing of panel 900. Less preferred embodiments may utilize a thicker conductive layer 210 wherein the conductive layer comprises one or more through holes allowing air to pass through it. However, it is contemplated that the use of thicker conducive layers having openings for air to pass through will result in poorer vacuum adhesion between conductive layer 210 and panel 900.

In preferred embodiments, the final surface topography will likely have test points and conductive traces leading to an interface with a test system. Coupling the chuck and any probes used with a test system would facilitate the automatic testing of panel 900.

A multi layer ceramic vacuum chuck can be used for applications where the distance between test points restricts the area available for conductors. Such a chuck may have the equivalent of a multi-layer interconnect in place of a single patterned conductive coating/layer.

Thus, specific embodiments and applications of a vacuum chuck comprising an air permeable conductive layer have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of testing a panel comprising:

providing a panel to be tested, the panel having at least one test point, proving a vacuum chuck comprising an air permeable conductive layer;

positioning the panel adjacent the conductive layer of the chuck;

evacuating at least a portion of the air between the conductive layer and the panel by causing the air being evacuated to flow from between the conductive layer and the panel and through the conductive layer; and attempting to establish a voltage or a current flow between the at least one test point and the air permeable conductive layer of the chuck and subsequently measuring any such established voltage or current flow.

2. The method of claim 1 wherein the vacuum chuck comprises a conductive base and a porous ceramic module, wherein the porous ceramic module comprises the air permeable conductive layer, and the ceramic module is mounted to the conductive base with the conductive layer electrically coupled to the conductive base.

3. The method of claim 2 wherein the conductive base further comprises at least one vacuum port such that applying vacuum to the port causes air adjacent to the air permeable conductive layer to flow through the conductive layer and through the ceramic module and out the vacuum port.

4. The method of claim 3 wherein the conductive base and air permeable conductive layer are electrically coupled via a conducting adhesive.

5. A vacuum chuck comprising:

a conductive base;

a porous ceramic module coupled to the conductive base;

an air permeable conductive layer coupled to the ceramic module and electrically coupled to the conductive base.

6. The chuck of claim 5 wherein the conductive base comprises a recess sized and dimensioned to receive at least a portion of the ceramic module; a vacuum port; and a vacuum line providing a fluid flow path between the vacuum port and the recess.

7. The chuck of claim 6 wherein application of vacuum to the vacuum port causes air adjacent to the conductive layer to flow through the conductive layer, the ceramic module, and the vacuum line and out the vacuum port.

8. The chuck of claim 7 wherein the conductive layer comprises a plurality of contact pads.

9. The chuck of claim 8 further comprising at least one alignment pin protruding outward from the conductive layer.

10. The chuck of claim 8 further comprising a heating element for converting electrical energy into heat transferred to the chuck.

11. The vacuum chuck of claim 5 wherein the porous ceramic module and air permeable conductive layer comprise a single unit formed by sputtering a conductive material onto a ceramic module.

12. The vacuum chuck of claim 11 wherein the sputtered conductive layer comprises a circuit formed by laser scribing, chemical etching, or selective sputtering.

* * * * *